US012625205B2

(12) United States Patent
Ohki et al.

(10) Patent No.: US 12,625,205 B2
(45) Date of Patent: May 12, 2026

(54) NUCLEAR MAGNETIC RESONANCE SENSING DEVICE AND NUCLEAR MAGNETIC RESONANCE SENSING METHOD

(71) Applicants: SUMIDA CORPORATION, Tokyo (JP); Kyoto University, Kyoto (JP)

(72) Inventors: Izuru Ohki, Kyoto (JP); Norikazu Mizuochi, Kyoto (JP); Yoshiharu Yoshii, Miyagi (JP); Tsunaki Kaneko, Miyagi (JP); Akifumi Sako, Miyagi (JP)

(73) Assignees: SUMIDA CORPORATION (JP); Kyoto University (JP)

( * ) Notice: Subject to any disclaimer, the term of this patent is extended or adjusted under 35 U.S.C. 154(b) by 210 days.

(21) Appl. No.: 18/700,532

(22) PCT Filed: Aug. 12, 2022

(86) PCT No.: PCT/JP2022/030783
§ 371 (c)(1),
(2) Date: Apr. 11, 2024

(87) PCT Pub. No.: WO2023/089883
PCT Pub. Date: May 25, 2023

(65) Prior Publication Data
US 2025/0004076 A1      Jan. 2, 2025

(30) Foreign Application Priority Data
Nov. 19, 2021      (JP) ................................. 2021-188930

(51) Int. Cl.
G01R 33/36          (2006.01)

(52) U.S. Cl.
CPC ..... G01R 33/3607 (2013.01); G01R 33/3621 (2013.01)

(58) Field of Classification Search
CPC ............ G01R 33/3607; G01R 33/3621; G01R 23/04; G01R 33/26; G01R 33/323
See application file for complete search history.

(56) References Cited

U.S. PATENT DOCUMENTS

| | | |
|---|---|---|
| 4,677,382 A | 6/1987 | Vatis |
| 5,739,691 A | 4/1998 | Hoenninger, III |
| | | (Continued) |

FOREIGN PATENT DOCUMENTS

| | | |
|---|---|---|
| JP | H01-130708 U | 9/1989 |
| JP | H07-502593 A | 3/1995 |
| | | (Continued) |

OTHER PUBLICATIONS

International Search Report of the International Searching Authority issued in PCT/JP2022/030783, mailed Sep. 13, 2022; ISA/JP (7 pages).

*Primary Examiner* — G.M. A Hyder
(74) *Attorney, Agent, or Firm* — Harness, Dickey & Pierce, P.L.C.

(57)          ABSTRACT

A nuclear magnetic resonance sensor applies a high frequency magnetic field based on an RF signal to a target and generates an observation signal with a frequency shifted from that of the RF signal by a frequency of an NMR signal. A mixer generates an IF demodulation signal including the NMR signal. A low-pass filter passes a low frequency component of the IF demodulation signal. In a digitizing device, a physical field generator generates a magnetic field corresponding to the IF demodulation signal passed through the low-pass filter, an optical quantum sensor generates light corresponding to the magnetic field by a sensing member and converts the light into a sensor signal by a photoelectric element, and an analog/digital converter digitizes the sensor signal. The optical quantum sensor performs a quantum (Continued)

operation on the sensing member and causes the sensing member to generate the light corresponding to the magnetic field.

11 Claims, 10 Drawing Sheets

(56)                    References Cited

U.S. PATENT DOCUMENTS

| | | | |
|---|---|---|---|
| 2005/0099182 A1* | 5/2005 | Park | G01R 33/3621 |
| | | | 324/318 |
| 2009/0286478 A1 | 11/2009 | Biber et al. | |
| 2013/0127461 A1 | 5/2013 | Popescu | |
| 2015/0276910 A1 | 10/2015 | Soejima et al. | |
| 2019/0277842 A1* | 9/2019 | Cleveland | G01R 33/323 |
| 2020/0225378 A1 | 7/2020 | Godoy et al. | |
| 2020/0292650 A1 | 9/2020 | Ohishi et al. | |

FOREIGN PATENT DOCUMENTS

| | | |
|---|---|---|
| JP | H09-266897 A | 10/1997 |
| JP | H10-099291 A | 4/1998 |
| JP | 2006-017486 A | 1/2006 |
| JP | 2008-039641 A | 2/2008 |
| JP | 2009-273889 A | 11/2009 |
| JP | 2011-101776 A | 5/2011 |
| JP | 2013-106950 A | 6/2013 |
| JP | 2014-138699 A | 7/2014 |
| JP | 2016024110 A | 2/2016 |
| JP | 2020-146150 A | 9/2020 |

* cited by examiner

NUCLEAR MAGNETIC RESONANCE SENSING DEVICE AND NUCLEAR MAGNETIC RESONANCE SENSING METHOD

CROSS REFERENCE TO RELATED APPLICATIONS

This application is a 371 U.S. National Phase of International Application No. PCT/JP2022/030783, filed on Aug. 12, 2022, which claims priority to Japanese Patent Application No. 2021-188930, filed Nov. 19, 2021. The entire disclosures of the above applications are incorporated herein by reference.

BACKGROUND

Technical Field

The present invention relates to a nuclear magnetic resonance sensing device and a nuclear magnetic resonance sensing method.

Related Art

FIG. 10 is a block diagram that shows an example of a measurement device using nuclear magnetic resonance. For instance, as shown in FIG. 10, in general, the measurement device using nuclear magnetic resonance: (a) makes nuclear magnetization resonate by applying a high frequency magnetic field based on an RF (Radio Frequency) signal having a frequency close to a precession frequency with a high frequency coil 311 with respect to a measuring object 301; (b) detects the resonated nuclear magnetization with a receiving coil 312 and generates an observation signal including a nuclear magnetic resonance (NMR) signal; (c) amplifies the observation signal by preamplifiers 313 and 314 such as a low noise amplifier (LNA), and (d) detects the amplified observation signal by a detector so as to extract the NMR signal.

Further, in general, such observation signals and NMR signals are converted from analog signals to digital signals by an analog/digital conversion circuit 315 and are supplied to a post-stage arithmetic processing device as digital signals (for instance, refer to Patent Documents 1 and 2).

PRIOR ART DOCUMENTS

Patent Documents

Patent Document 1: Japanese Patent Publication Number 2008-039641.
Patent Document 2: Japanese Patent Publication Number 2011-101776.

However, in the above-mentioned device, because an amplifier circuit such as a preamplifier is provided in order to amplify the observation signal, noise being peculiar to the amplifier circuit is superposed on the observation signal and the NMR signal. For this reason, the NMR signals with a level similar to or lower than the noise floor of the amplifier circuit are buried in noise, and it is difficult to accurately detect such low-level NMR signals.

The present invention has an object that is to obtain a nuclear magnetic resonance sensing device and a nuclear magnetic resonance sensing method that can accurately detect a low-level NMR signal and have high resolution in view of the above-described problems.

SUMMARY

A nuclear magnetic resonance sensing device according to the present invention includes a nuclear magnetic resonance sensing part that applies a high frequency magnetic field based on an RF signal to a target object and generates an observation signal with a frequency that is shifted from a frequency of the RF signal by a frequency of a nuclear magnetic resonance signal, a mixer part that performs intermediate frequency demodulation of the observation signal and generates an intermediate frequency demodulation signal including the nuclear magnetic resonance signal, a low-pass filter that attenuates a high frequency band component among two band components obtained by the intermediate frequency demodulation of the intermediate frequency demodulation signal and passes a low frequency band component among two band components, and a digitizing device that digitizes the intermediate frequency demodulation signal that has passed through the low-pass filter. The digitizing device includes a physical field generator that generates a magnetic field or an electric field corresponding to the intermediate frequency demodulation signal that has passed through the low-pass filter, an optical quantum sensor part that generates light corresponding to the magnetic field or the electric field by a sensing member and converts the light into an electrical signal as a sensor signal by a photoelectric element, and an analog/digital converter that digitizes the sensor signal. The optical quantum sensor part performs a quantum operation with respect to the sensing member and causes the sensing member to generate the light corresponding to the magnetic field or the electric field.

A nuclear magnetic resonance sensing device includes a nuclear magnetic resonance sensing part that applies a high frequency magnetic field based on an RF signal to a target object and generates an observation signal with a frequency that is shifted from a frequency of the RF signal by a frequency of a nuclear magnetic resonance signal, a mixer part that performs intermediate frequency demodulation of the observation signal and generates an intermediate frequency demodulation signal including the nuclear magnetic resonance signal, a low-pass filter that attenuates a high frequency component higher than an intermediate frequency of the intermediate frequency demodulation of the intermediate frequency demodulation signal and passes a frequency component of the nuclear magnetic resonance signal, an analog quadrature phase detection circuit that performs quadrature phase detection with respect to the intermediate frequency demodulation signal that has passed through the low-pass filter and generates a demodulation signal and a demodulated signal of the nuclear magnetic resonance signal, and a digitizing device that digitizes the demodulation signal and the demodulated signal. The digitizing device includes a first physical field generator that generates a magnetic field or an electric field corresponding to the demodulation signal, a second physical field generator that generates a magnetic field or an electric field corresponding to the demodulated signal, a first optical quantum sensor part that generates light, by a first sensing member, corresponding to the magnetic field or the electric field generated by the first physical field generator and converts, by a first photoelectric element, the light generated by the first sensing member into an electrical signal as a first sensor signal, a second optical quantum sensor part that generates light, by a second sensing member, corresponding to the magnetic field or the electric field generated by the second physical field generator and converts, by a second photoelectric element, the light generated by the second sensing member into an electrical signal as a second sensor signal, a first analog/digital converter that digitizes the first sensor signal, and a second analog/digital converter that digitizes the second sensor signal. The first and second optical quantum sensor parts respectively perform quantum operations with respect to the first and second sensing members and respectively cause the first and second sensing members to generate the lights corresponding to the magnetic fields or the electric fields.

A nuclear magnetic resonance sensing method includes a step of applying a high frequency magnetic field based on an RF signal to a target object and generating an observation signal with a frequency that is shifted from a frequency of the RF signal by a frequency of a nuclear magnetic resonance signal, a step of performing intermediate frequency demodulation of the observation signal and generating an intermediate frequency demodulation signal including the nuclear magnetic resonance signal, a step of attenuating, by a low-pass filter, a high frequency band component among two band components obtained by the intermediate frequency demodulation of the intermediate frequency demodulation signal and passing a low frequency band component among two band components, and a digitizing step of digitizing, by a digitizing device, the intermediate frequency demodulation signal that has passed through the low-pass filter. The digitizing step includes (a) generating a magnetic field or an electric field corresponding to the intermediate frequency demodulation signal that has passed through the low-pass filter, (b) generating light corresponding to the magnetic field or the electric field by a sensing member, (c) converting the light into an electrical signal as a sensor signal by a photoelectric element, and (d) digitizing the sensor signal by an analog/digital converter. In the digitizing step, a quantum operation with respect to the sensing member is performed, and the sensing member is caused to generate the light corresponding to the magnetic field or the electric field.

A nuclear magnetic resonance sensing method includes a step of applying a high frequency magnetic field based on an RF signal to a target object and generating an observation signal with a frequency that is shifted from a frequency of the RF signal by a frequency of a nuclear magnetic resonance signal, a step of performing intermediate frequency demodulation of the observation signal and generating an intermediate frequency demodulation signal including the nuclear magnetic resonance signal, a step of attenuating, by a low-pass filter, a high frequency component higher than an intermediate frequency of the intermediate frequency demodulation of the intermediate frequency demodulation signal and passing a frequency component of the nuclear magnetic resonance signal, a step of performing, by an analog circuit, quadrature phase detection with respect to the intermediate frequency demodulation signal that has passed through the low-pass filter and generating a demodulation signal and a demodulated signal of the nuclear magnetic resonance signal, and a digitizing step of digitizing the demodulation signal and the demodulated signal. The digitizing step includes (a1) generating a magnetic field or an electric field corresponding to the demodulation signal, (a2) generating a magnetic field or an electric field corresponding to the demodulated signal, (b1) generating light, by a first sensing member, corresponding to the magnetic field or the electric field corresponding to the demodulation signal and converting, by a photoelectric element, the light generated by the first sensing member into an electrical signal as a first sensor signal, (b2) generating light, by a second sensing member, corresponding to the magnetic field or the electric field corresponding to the demodulated signal and converting, by a photoelectric element, the light generated by the second sensing member into an electrical signal as a second sensor signal, (c1) digitizing the first sensor signal, and (c2) digitizing the second sensor signal. In the digitizing step, quantum operations with respect to the first and second sensing members are respectively performed, and the first and second sensing members are respectively caused to generate the lights corresponding to the magnetic fields or the electric fields corresponding to the demodulation signal and the demodulated signal.

Effects of the Invention

According to the present invention, it is possible to obtain a nuclear magnetic resonance sensing device and a nuclear magnetic resonance sensing method that can accurately detect a low-level NMR signal and have high resolution.

DETAILED DESCRIPTION

Embodiments of the present invention will be explained below with reference to the drawings.

First Embodiment

Figure 1:
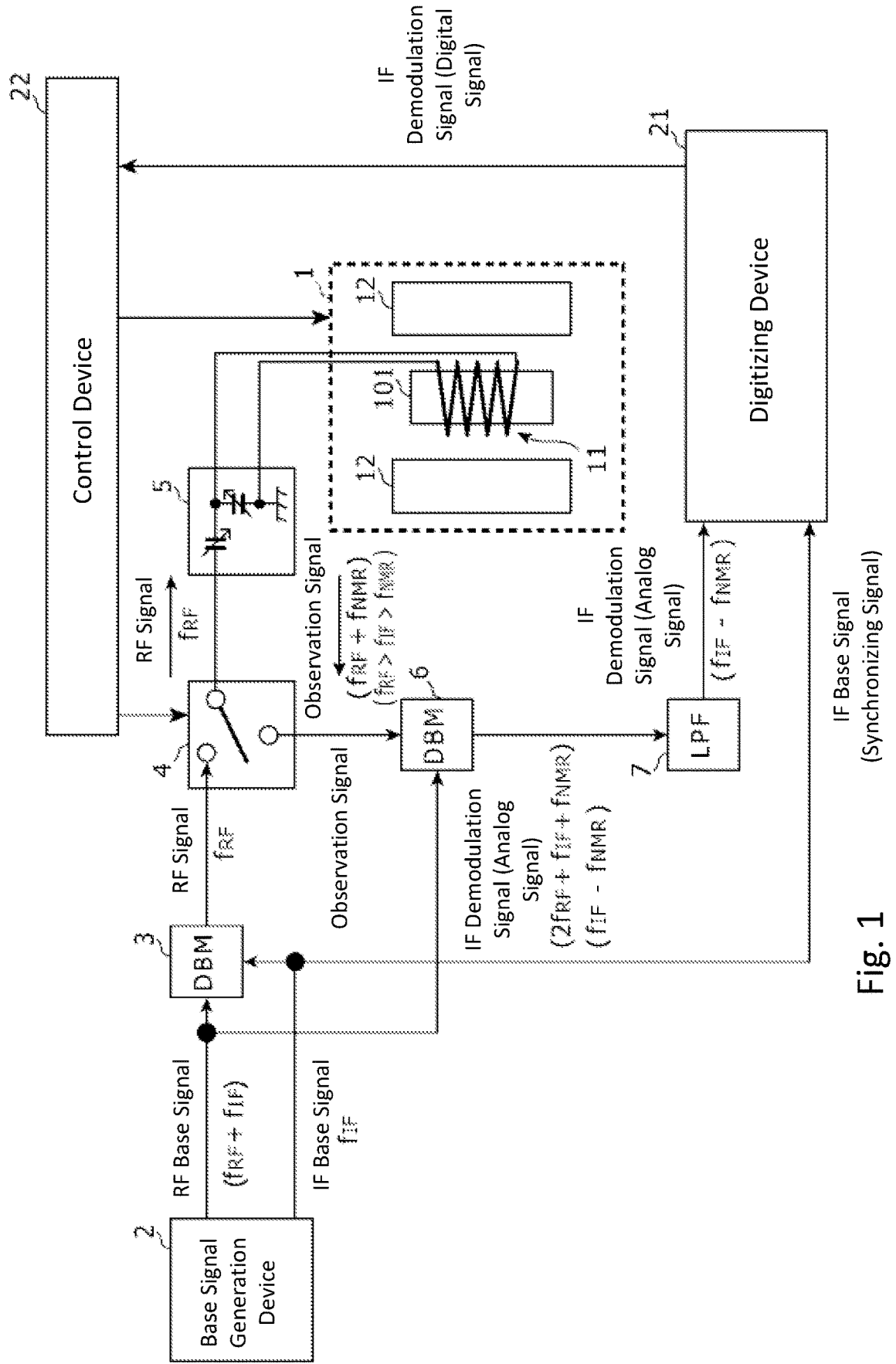
FIG. 1 is a block diagram that shows a configuration of a nuclear magnetic resonance sensing device according to a first embodiment of the present invention.

FIG. 1 is a block diagram that shows a configuration of a nuclear magnetic resonance sensing device according to a first embodiment of the present invention. The nuclear magnetic resonance sensing device is used for, for instance, a molecular structure analysis and imaging of a target object.

The nuclear magnetic resonance sensing device shown in FIG. 1 has a nuclear magnetic resonance sensing part 1, a base signal generation device 2, a mixer part 3, a switching part 4, a matching/tuning circuit 5, a mixer part 6, and a low-pass filter 7.

The nuclear magnetic resonance sensing part 1 applies an RF signal described below to a target object and generates an observation signal (an analog electrical signal) with a frequency ($f_{RF}+f_{NMR}$) that is shifted from a frequency $f_{RF}$ of the RF signal by a frequency $f_{NMR}$ of a nuclear magnetic resonance (NMR) signal.

Specifically, the nuclear magnetic resonance sensing part 1 has a coil 11 and a magnet part 12. The coil 11 applies a high frequency magnetic field based on the RF signal to the target object 101, senses a magnetic field change based on movement (motion) of nuclear magnetization in the target object 101, and outputs an observation signal. The magnet part 12 is a permanent magnet or an electromagnet and applies a static magnetic field or a gradient magnetic field to the target object 101. This observation signal includes the NMR signal and has the frequency ($f_{RF}+f_{NMR}$) that is the sum of the frequency NMR and the RF signal frequency $f_{RF}$.

The base signal generation device 2 generates and outputs an intermediate frequency (IF) base signal having a single intermediate frequency fir and an RF base signal having a single frequency that is the sum of the frequency $f_{RF}$ of the RF band and the intermediate frequency $f_{IF}$.

The mixer part 3 mixes the RF base signal and the IF base signal and generates the RF signal having the frequency $f_{RF}$. Further, the mixer part 3 performs SSB (Single Side Band) modulation and outputs only the RF signal of the frequency $f_{RF}$ among two frequency components of ($f_{RF}+2f_{IF}$) and $f_{RF}$ that are obtained by the mixing without outputting the component of the frequency ($f_{RF}+2 f_{IF}$).

For instance, the mixer part 3 is a DBM (Double Balanced Mixer) that is configured with a diode and a phase distributor.

The switching part 4 switches a connection destination for a side of the nuclear magnetic resonance sensing part 1 (the nuclear magnetic resonance sensing part via the matching/tuning circuit 5) from one of a transmission system of the RF signal (the base signal generation device 2 and the mixer part 3) and a reception system of the observation signal (the base signal generation device 2, the mixer part 6, and the low-pass filter 7) to the other. Specifically, when transmitting the RF signal, the switching part 4 electrically connects the transmission system to the side of the nuclear magnetic resonance sensing part 1, and when receiving the observation signal, the switching part 4 electrically connects the reception system to the side of the nuclear magnetic resonance sensing part 1.

The matching/tuning circuit 5 is a circuit that performs an impedance matching so as to suppress a reflection of the RF signal at the nuclear magnetic resonance sensing part 1, and at the same time, performs a frequency tuning so as to improve a level of the NMR signal.

The mixer part 6 mixes the observation signal and the RF base signal, performs intermediate frequency (IF) demodulation, and generates and outputs an intermediate frequency (IF) demodulation signal having two frequency components of ($2f_{RF}+f_{IF}+f_{NMR}$) and ($f_{IF}-f_{NMR}$).

For instance, the mixer part 6 is a DBM that is configured with a diode and a phase distributor and does not include an active element such as a transistor.

The low-pass filter 7 attenuates a high frequency band component ($2f_{RF}+f_{IF}+f_{NMR}$) among two band components of ($2f_{RF}+f_{IF}+f_{NMR}$) and ($f_{IF}-f_{NMR}$) that are obtained by the IF demodulation by the mixer part 6 of the above-mentioned IF demodulation signal and is a filter that passes a low frequency band component ($f_{IF}-f_{NMR}$) among two band components. Further, the low-pass filter 7 is an analog filter that is configured with only passive elements, such as a capacitor, an inductor, or a resistor.

Further, the nuclear magnetic resonance sensing device shown in FIG. 1 has a digitizing device 21 and a control device 22.

The digitizing device 21 converts the IF demodulation signal (the frequency component ($f_{IF}-f_{NMR}$)) that is output from the low-pass filter 7 from an analog signal to a digital signal.

The control device 22 has a computer that operates according to a control program. The computer has such as a CPU (Central Processing Unit), a ROM (Read Only Memory), and a RAM (Random Access Memory) and performs operations (processes) described below by loading the control program into the RAM and executing it via the CPU. Specifically, the control device 22 controls the nuclear magnetic resonance sensing part 1 and the switching part 4 so that the nuclear magnetic resonance sensing part 1 applies the above-mentioned high frequency magnetic field and outputs the above-mentioned observation signal. Furthermore, the control device 22 receives the IF demodulation signal (frequency component ($f_{IF}-f_{NMR}$)) as a digital signal from the digitizing device 21 and performs a predetermined signal processing (for instance, an extraction of the frequency component $f_{NMR}$) so that the frequency $f_{NMR}$ component (that is, the NMR signal) is extracted from the IF demodulation signal (the frequency component ($f_{IF}-f_{NMR}$)).

For instance, fir is a frequency that is 1000 times higher than $f_{NMR}$. $f_{RF}$ is a frequency that is 10 times higher than $f_{IF}$. For instance, when $f_{NMR}$=1 KHZ, $f_{RF}$=43 MHz, and $f_{IF}$=1 MHZ.

Figure 2:
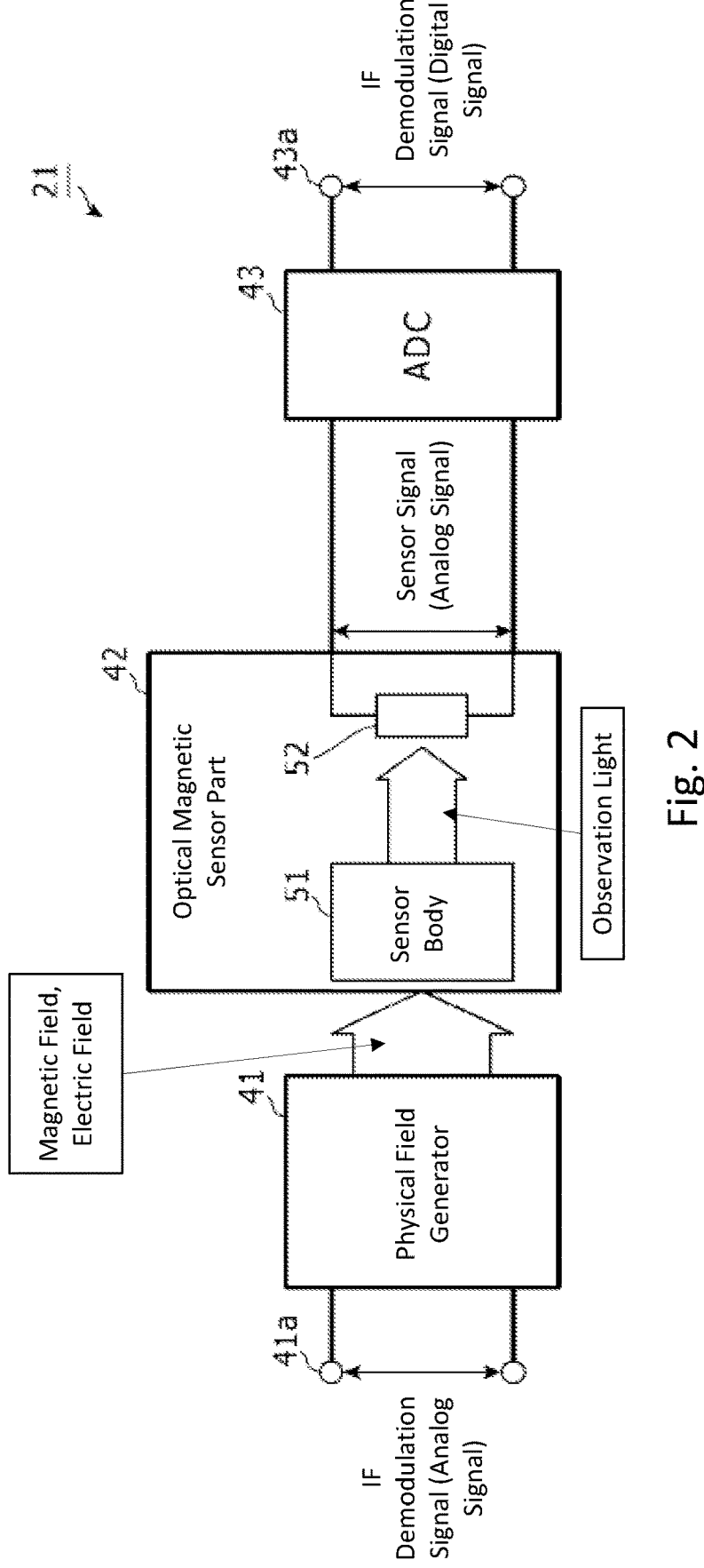
FIG. 2 is a block diagram that shows a configuration of a digitizing device 21 in FIG. 1.

FIG. 2 is a block diagram that shows a configuration of the digitizing device 21 shown in FIG. 1. The digitizing device shown in FIG. 1 has a physical field generator 41, an optical quantum sensor part 42, and an analog/digital converter (A/D converter, ADC) 43.

The physical field generator 41 generates a magnetic field corresponding to an input signal (that is, an analog IF demodulation signal) that is input via an input terminal 41a of the physical field generator 41. For instance, the physical field generator 41 generates the magnetic field using a conductive coil or wiring.

The optical quantum sensor part 42 has a sensor body 51 and a photoelectric element 52. In the sensor body 51, a sensing member generates light (observation light) corresponding to the magnetic field that is generated by the physical field generator 41 and the photoelectric element 52 converts the light into an electrical signal as a sensor signal. The photoelectric element 52 is, for instance, a photodiode or a phototransistor and generates the sensor signal corresponding to intensity of the entered observation light.

Specifically, the optical quantum sensor part 42 (specifically, the sensor body 51) performs a quantum operation (here, a quantum operation by a microwave and a laser beam) on the sensing member so that the sensing member generates the light corresponding to the magnetic field that is generated by the physical field generator 41.

In the first embodiment, the optical quantum sensor part 42 (specifically, the sensor body 51) performs the quantum operation on the sensing member according to an optically detected magnetic resonance measuring method (ODMR) so that the sensing member generates the above-mentioned observation light.

Figure 3:
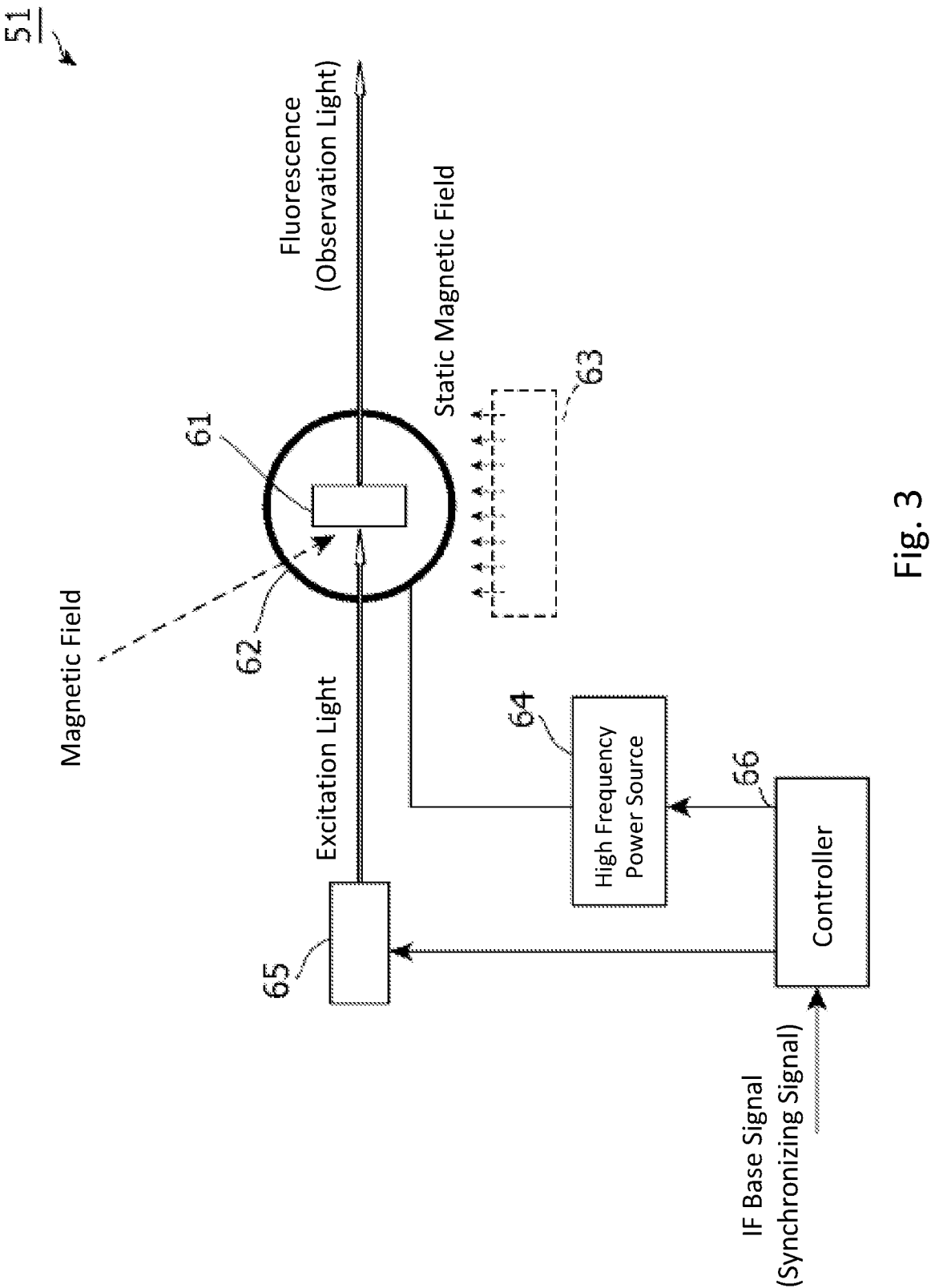
FIG. 3 is a diagram that shows a configuration of a sensor body 51 in the digitizing device according to the first embodiment.

FIG. 3 is a diagram that shows the configuration of the sensor body 51 in the digitizing device according to the first embodiment. In the first embodiment, for the ODMR, for instance, as shown in FIG. 3, the sensor body 51 has a magnetic resonance member 61 as the sensing member, a high frequency magnetic field generator 62, a magnet 63, a high frequency power source 64, a light emitting device 65, and a controller 66.

The magnetic resonance member 61 has a crystal structure. The electron spin quantum state changes in correspond with the magnetic field that is generated by the physical field generator 41, and at the same time, the magnetic resonance member 61 is a member capable of an electron spin quantum operation by a microwave (based on Rabi vibration) at a frequency that corresponds to a defect in a crystal lattice and an arrangement direction of impurities. That is, the magnetic resonance member 61 is placed within the above-mentioned magnetic field.

In this embodiment, the magnetic resonance member 61 is an optically detected magnetic resonance member having a plurality (that is, an ensemble) of specific color centers. This specific color center has an energy level capable of Zeeman splitting, and at the same time, can take a plurality of directions in which shift widths of the energy level at the time of Zeeman splitting are different from each other.

Here, the magnetic resonance member 61 is a member such as a diamond that includes a plurality of NV (Nitrogen Vacancy) centers as a specific color center of a single category (or type). In the case of the NV center, a ground state is a triplet state of $ms=0, +1, -1$ and a level of $ms=+1$ and a level of $ms=-1$ undergo Zeeman splitting. When the NV center transitions from an excited state at the levels of $ms=+1$ and $ms=-1$ to the ground state, the NV center is accompanied by fluorescence at a predetermined proportion and the remaining proportion of the NV center transitions from the excited state ($ms=+1$ or $ms=-1$) to the ground state ($ms=0$) with non-radiation.

Note that the color center included in the magnetic resonance member 61 may be a color center other than the NV center.

The high frequency magnetic field generator 62 applies a microwave to the magnetic resonance member 61 so as to perform an electron spin quantum operation of the magnetic resonance member 61. For instance, the high frequency magnetic field generator 62 is a plate-shaped coil and has a substantially circular coil part that emits the microwave and terminal parts that extend from both ends of the coil part and are fixed to a substrate. The high frequency power source 64 generates a current of the microwave and is conductively connected to the high frequency magnetic field generator 62. The coil part conducts two currents that are mutually in parallel at a predetermined interval so as to sandwich the magnetic resonance member 61 at both end surface parts of the coil part and emit the above-mentioned microwave. Here, the coil part is the plate-shaped coil, however, because the current of the microwave flows through the end surface part of the coil part due to a skin effect, two currents are formed. As a result, the microwave with a substantially uniform intensity is applied to the magnetic resonance member 61.

In the case of the NV center, since the color center is formed by a defect (vacancy) (V) and nitrogen (N) as an impurity in the diamond crystal, there are four possible positions for adjacent nitrogen (N) with respect to the defect (vacancy) (V) in the diamond crystal (that is, the arrangement directions of a pair of the vacancy and the nitrogen). Sub-levels (that is, the energy levels from the ground) after Zeeman splitting respectively corresponding to these arrangement directions are different from each other. Therefore, in a characteristic of a fluorescence intensity after Zeeman splitting due to a static magnetic field with respect to a frequency of the microwave, in correspond with each direction i ($i=1, 2, 3, 4$), four pairs of dip frequencies (fi+, fi−) that are different from one another appear. Here, the above-mentioned frequency of the microwave (wavelength) is set in correspond with any of the dip frequencies of these four pairs of dip frequencies.

Further, the magnet 63 applies a static magnetic field (a DC magnetic field) to the magnetic resonance member 61 so that the energy levels of a plurality of specific color centers (here, a plurality of NV centers) in the magnetic resonance member 61 undergo Zeeman splitting. Here, the magnet 63 is a ring-type permanent magnet, such as a ferrite magnet, an alnico magnet, or a samarium cobalt magnet. Further, the magnet 63 may be an electromagnet.

Further, in the magnetic resonance member 61, as the arrangement direction of the above-mentioned defect and impurity is substantially coincident with the above-mentioned direction of the static magnetic field (and the direction of the applied magnetic field), the crystal of the magnetic resonance member 61 is formed and the direction of the magnetic resonance member 61 is set.

Furthermore, in this embodiment, in order to irradiate the magnetic resonance member 41 with excitation light, an optical system (not shown) from the light emitting device 65 to the magnetic resonance member 61 is provided. Further, in order to detect fluorescence (the observation light) from the magnetic resonance member 61, an optical system (not shown) from the magnetic resonance member 61 to the photoelectric element 52 is provided.

The observation light is concentrated toward the photoelectric element 52 by an optical system such as a compound parabolic concentrator (CPC). For instance, the magnetic resonance member 61 is arranged on the CPC, and among the fluorescence that is emitted in all directions from a color center in the magnetic resonance member 61, the fluorescent that is emitted in a wide solid angle (for instance, more than a predetermined percentage of all directions) by this optical system is concentrated.

The light emitting device 65 has such as a laser diode as a light source and the light source emits a laser beam (laser light) of a predetermined wavelength as excitation light to be irradiated to the magnetic resonance member 61.

According to a predetermined measurement sequence, the controller 66 (a) controls the high frequency power source 64 and the light emitting device 65, performs a quantum operation using the microwave and the laser light mentioned above, causes the sensor body 51 to generate the observation light, and causes the photoelectric element 52 to generate the sensor signal. For instance, the controller 66 has a computer that operates according to a control program. The computer has a CPU, a ROM, a RAM (Random Access Memory), etc., and performs the above-mentioned operations (or processes) by loading the control program into the RAM and executing it on the CPU. Further, the controller 66 may be built into the control device 22 or the control device 22 may operate as the controller 66.

Figure 4:
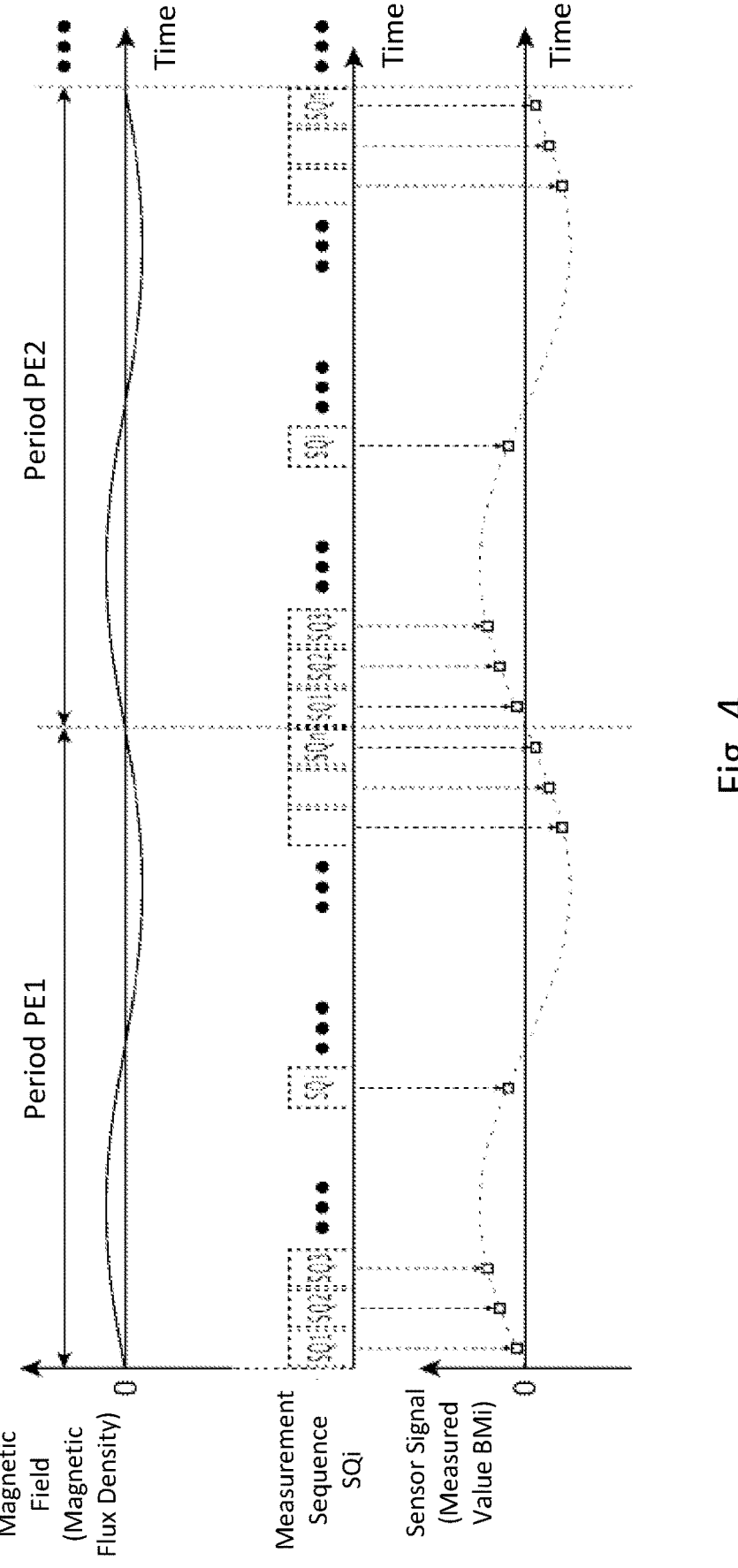
FIG. 4 is a diagram that explains an example of a sensor signal in the digitizing device according to the first embodiment.

FIG. 4 is a diagram that explains an example of a sensor signal in the digitizing device according to the first embodiment. This measurement sequence is set according to such as the frequency of the above-mentioned magnetic field. For instance, when the input signal (the IF demodulation signal) is an AC signal with a relatively low frequency (for instance, several tens Hz), as shown in FIG. 4, with Ramsey pulse sequences (that is, the measurement sequences SQ1-SQn in the DC magnetic field) during one cycle, the measurements of the above-mentioned magnetic field corresponding to the input signal is performed a plurality of times (n times), and the measured values BM1-BMn are obtained as the sensor signals. As a result, the sensor signal at the level corresponding to the magnetic field strength at the time of each measurement sequence is generated.

Further, for instance, when the above-mentioned magnetic field is an AC magnetic field with a relatively high frequency (for instance, several tens kHz), a spin echo pulse sequence (for instance, Hahn echo sequence) may be applied to the measurement sequence. However, the measurement sequence is not limited to these sequences, and may be selected according to the frequency of the magnetic field of the measurement target. For instance, when the period of the above-mentioned magnetic field is equal to or longer than a T2 relaxation time, the magnetic field measurements are performed the plurality of times with Ramsey pulse sequences as mentioned above. When the period of the above-mentioned magnetic field is shorter than the T2 relaxation time, the spin echo pulse sequence (for instance, Hahn echo sequence) may be applied. Furthermore, when the period of the above-mentioned magnetic field is shorter than ½ of the T2 relaxation time, the magnetic field measurement may be performed according to a Qdyne method.

Refer back to FIG. 2, the A/D converter 43 digitizes the above-mentioned sensor signal (without digitizing the input signal). As a result, the A/D converter 43 generates a digital signal as an output signal corresponding to the input signal (IF demodulation signal) and outputs it via an output terminal 43a of the A/D converter 43.

In this embodiment, in particular, the optical quantum sensor part 42 (specifically, the sensor body 51) causes the sensing member to generate the above-mentioned observation light in a state in which the level of the sensor signal exceeds the noise floor of the A/D converter 43.

Here, the level (amplitude) of the sensor signal changes according to a factor, such as the efficiency of the sensing member (in the first embodiment, for instance, the type or the number of the color centers in the magnetic resonance member 61), the light concentration efficiency of the observation light (in the first embodiment, the amount of the entered light to the photoelectric element 52 relative to the light emission amount of the color center), or the conversion efficiency of the photoelectric element 52 (the level of the sensor signal relative to the amount of the entered light). Therefore, according to the noise floor (already known) of the A/D converter 43, the value(s) of the factor(s) is determined so that the level of the sensor signal exceeds the noise floor of the A/D converter 43. As a result, for instance, the sensitivity of the optical quantum sensor part 42 is set to 1.5 PT/Hz$^{1/2}$ or more.

Further, in general, the noise of an A/D converter includes quantization noise and thermal noise, and in a high-resolution A/D converter, the thermal noise is more dominant than the quantization noise. The A/D converter 43 in this embodiment is a high-resolution A/D converter and the value(s) of the above-mentioned factor(s) is determined so that the level of the sensor signal exceeds the noise level of the thermal noise.

Further, a reference voltage of the A/D converter 43 is set according to a range (a minimum level value and a maximum level value) of the sensor signal. Further, by lowering the reference voltage of the A/D converter, the quantization noise is reduced, however, the thermal noise is not reduced.

Note that a level (or a range) of the IF demodulation signal being input and electromagnetic conversion efficiency of the physical field generator 41 are already known.

Furthermore, in this embodiment, in particular, the digitizing device 21 does not have an amplifier circuit, in which the sensor signal is electrically amplified, between the photoelectric element 52 and the A/D converter 43. Furthermore, in this embodiment, an amplifier circuit, in which the input signal is electrically amplified, is not provided between a signal source of the input signal and the physical field generator 41. That is, in this embodiment, an electrical amplifier circuit that is a noise source is not provided at an upstream side of the A/D converter 43. Because the thermal noise is generated and amplified in such the amplifier circuit in the same way as the A/D converter 43, the noise is superposed on a signal that is input to the A/D converter 43. Therefore, it is preferred that an amplifier circuit is not provided as mentioned above.

Further, the high frequency power source 64 and the controller 66 are electrically separated from the A/D converter 43 so as to prevent the electrical noise that is generated by the high frequency power source 64 and the controller 66 from invading (inputting) into the A/D converter 43.

Furthermore, in this first embodiment, the mixer part 6 performs intermediate frequency demodulation of the observation signal using the RF base signal so as to generate an IF demodulation signal including the NMR signal. Further, the optical quantum sensor part 42 (the controller 66) uses the IF base signal as a synchronizing signal and repeatedly and periodically performs a quantum operation with respect to the sensing member according to the synchronizing signal so that the light corresponding to the magnetic field is generated by the sensing member. As a result, the digitizing device 21 outputs a digital IF demodulation signal in synchronization with the IF base signal. Thus, the control device 22 accurately identifies the frequency fNMR of the NMR signal based on this digital IF demodulation signal according to the Qdyne method.

Further, in this first embodiment, neither an amplifier circuit nor a buffer is provided between the nuclear magnetic resonance sensing part 1 and the digitizing device 21. That is, since only a passive element is used in a circuit from the nuclear magnetic resonance sensing part 1 to the digitizing device 21, the generation of the thermal noise is suppressed.

Next, operations of the nuclear magnetic resonance sensing device according to the first embodiment will be explained.

The control device 22 controls the nuclear magnetic resonance sensing part 1, and at the same time, controls the switching part 4. The control device 22 applies a high frequency magnetic field based on the RF signal from the transmission system to the target object 101 in the nuclear magnetic resonance sensing part 1. The control device 22 controls the switching part 4 so as to conduct the observation signal from the nuclear magnetic resonance sensing part 1 to the reception system.

As shown in FIG. 1, the observation signal is converted into the IF demodulation signal by the mixer part 6. Further, the IF demodulation signal from which the component on the side of the high frequency band is removed by the low-pass filter 7 is input to the digitizing device 21.

In the digitizing device 21, when the IF demodulation signal is applied to the physical field generator 41, a magnetic field with an intensity corresponding to the level of the input signal is generated in the physical field generator 41 and is applied to the sensor body 51 of the optical quantum sensor part 42.

In the sensor body 51, the measurement sequence is executed as mentioned above, and the light having a light quantity corresponding to the strength of the magnetic field is generated. In the first embodiment, according to the ODMR, the magnetic resonance member 61 generates the light having the light quantity corresponding to the strength of the magnetic field.

Thereafter, the photoelectric element 52 receives the light, generates the sensor signal having the level corresponding to the light quantity of the received light, and outputs the sensor signal to the A/D converter 43.

The A/D converter 43 digitizes the sensor signal, generates the digital IF demodulation signal corresponding to the analog IF demodulation signal, and outputs the digital IF demodulation signal to the control device 22.

The control device 22 continuously and repeatedly acquires values of the digital IF demodulation signal, derives the NMR signal (specifically, for instance, $f_{NMR}$) by the signal processing as mentioned above, and performs such as the molecular structure analysis or the imaging of the target object 101 based on the NMR signal.

As mentioned above, according to the first embodiment, the nuclear magnetic resonance sensing part 1 applies the RF signal to the target object 101 and generates the observation signal having the frequency that is the sum of the frequency of the RF signal and the frequency of the nuclear magnetic resonance signal. The mixer part 6 performs the IF demodulation of the observation signal and generates the IF demodulation signal including the nuclear magnetic resonance signal. The low-pass filter 7 attenuates the high frequency band component among the two band components that are obtained by the IF demodulation of the IF demodulation signals and passes the low frequency band component among the two band components. The digitizing device 21 digitizes the IF demodulation signal that has been passed through the low-pass filter 7. In the digitizing device 21, the physical field generator 41 generates a magnetic field or an electric field corresponding to the intermediate frequency demodulation signal that has been passed through the low-pass filter 7. In the optical quantum sensor part 42, the sensing member generates the light corresponding to the magnetic field or the electric field, the photoelectric element converts the light into the electrical signal as the sensor signal, and the analog/digital converter 43 digitizes the sensor signal. This optical quantum sensor part 42 performs the quantum operation with respect to the above-mentioned sensing member and causes the sensing member to generate the light corresponding to the above-mentioned magnetic field or the above-mentioned electric field.

As a result, by using the physical field generator 41 and the optical magnetic sensor part 42, a relatively high-level sensor signal corresponding to a weak IF demodulation signal is obtained and digitized. As a result, the IF demodulation signal (digital signal) including the NMR signal can be accurately obtained. Therefore, a minute IF demodulation signal with a level that is similar to or lower than the noise level of the A/D converter 43 is accurately digitized. In addition, it becomes possible to accurately detect the low-level NMR signal and perform the high-resolution nuclear magnetic resonance sensing.

Second Embodiment

In the second embodiment, the optical quantum sensor part 42 performs a quantum operation with respect to the sensing member according to an optically pumped atomic magnetic force measuring method (OPAM) instead of the ODMR and causes the sensing member to generate the light corresponding to the magnetic field.

Figure 5:
FIG. 5 is a diagram that shows a configuration of a sensor body 51 in the digitizing device according to a second embodiment.
Figure 5:

FIG. 5 is a diagram that shows a configuration of a sensor body 51 in a digitizing device according to the second embodiment. In the second embodiment, the sensor body 51 has a cell 71, a magnet 72, light emitting devices 73 and 74 for the OPAM.

The cell 71 is such as a transparent (permeable or transmissible) glass cell. Alkali metal atoms (for instance, K, Rb, Cs) as a sensing member 71a are sealed along with buffer gas in the cell 71. The magnet 72 is a magnet that applies static magnetism to the sensing member and may be the above-mentioned permanent magnet or an electromagnet.

The light emitting device 73 generates pump light and irradiates the pump light to the sensing member 71a. The light emitting device 74 generates probe light and irradiates the probe light to the sensing member 71a. In an OPAM measurement sequence, a spin polarization is generated in the sensing member by optical pumping of the pump light and a rotation of the spin polarization corresponding to the magnetic field is measured by a magnetic optical rotation of the probe light. Specifically, a deflection rotation angle of an observation light (that is, the probe light after the magnetic optical rotation) is detected. The deflection rotation angle of the observation light is detected by a plurality of photoelectric elements 52 using such as a four-detector method. When the deflection rotation angle is detected by the plurality of photoelectric elements 52, an arithmetic processing (for instance, a difference calculation) may be performed after sensor signals are respectively digitized by a plurality of A/D converters 43 to become a plurality of digital signals.

Note that the other configurations and operations of the nuclear magnetic resonance sensing device according to the second embodiment are the same as those explained in the first embodiment. Therefore, the explanations of the other configurations and operations of the nuclear magnetic resonance sensing device according to the second embodiment will be omitted.

Third Embodiment

In a third embodiment, the physical field generator 41 generates an electric field corresponding to an input signal (that is, an analog IF demodulation signal) being input via the input terminal 41a of the physical field generator 41. The optical quantum sensor part 42 causes a sensing member in the sensor body 51 to generate light (observation light) corresponding to the electric field that is generated by the physical field generator 41 and causes the photoelectric element 52 to convert the light into an electrical signal as a sensor signal.

For instance, the physical field generator 41 generates the electric field using a pair of electrode plates. Further, this input signal may be an AC signal with a single frequency, an AC signal with a predetermined period having a plurality of frequency components, or a DC signal. That is, the above-mentioned electric field is, such as an AC electric field with a single frequency, an AC electric field with a predetermined period having a plurality of frequency components, or a DC electric field, according to the input signal.

Note that the other configurations and operations of the nuclear magnetic resonance sensing device according to the third embodiment are the same as those explained in the first embodiment or the second embodiment. Therefore, the explanations of the other configurations and operations of the nuclear magnetic resonance sensing device according to the third embodiment will be omitted. However, the sensing members being used in the ODMR and the OPAM are those in which a quantum state changes depending on the electric field and in which an electric field can be measured in the same or a similar measurement sequence.

Fourth Embodiment

Figure 6:
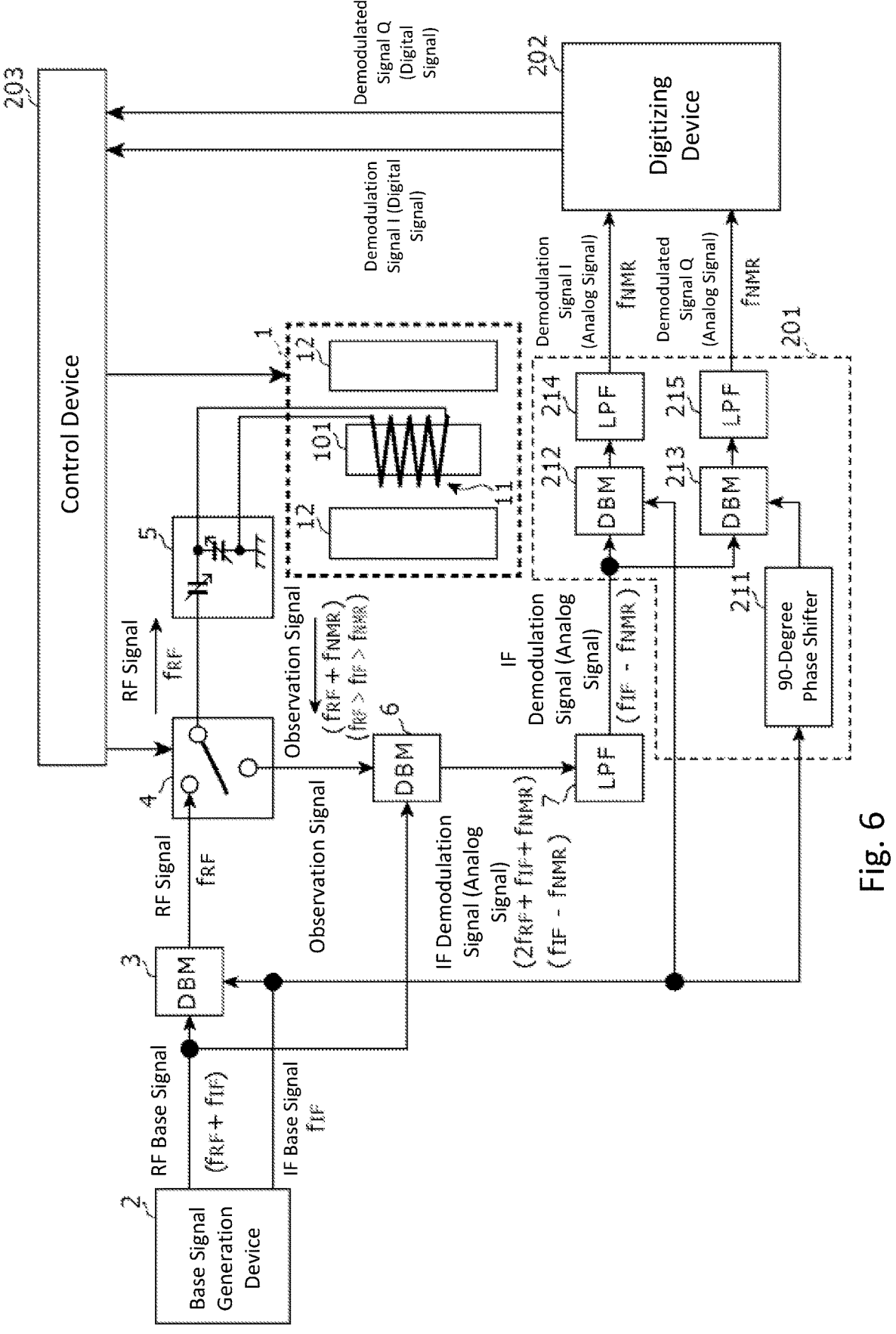
FIG. 6 is a block diagram that shows a configuration of a nuclear magnetic resonance sensing device according to a fourth embodiment of the present invention.

FIG. 6 is a block diagram that shows a configuration of a nuclear magnetic resonance sensing device according to a fourth embodiment of the present invention.

As shown in FIG. 6, the nuclear magnetic resonance sensing device according to the fourth embodiment has the nuclear magnetic resonance sensing part 1, the base signal generation device 2, the mixer part 3, the switching part 4, the matching/tuning circuit 5, the mixer part 6, and the low-pass filter 7 in the same manner as the first embodiment. In addition, the nuclear magnetic resonance sensing device according to the fourth embodiment has also an analog quadrature phase detection circuit 201, a digitizing device 202, and a control device 203.

The analog quadrature phase detection circuit 201 performs quadrature phase detection with respect to the intermediate frequency demodulation signal that has been passed through the low-pass filter 7 so as to generate a demodulation signal I and a demodulated signal Q of the nuclear magnetic resonance signal.

Specifically, the analog quadrature phase detection circuit 201 has a 90-degree phase shifter 211, mixer parts 212 and 213, and low-pass filters 214 and 215. The 90-degree phase shifter 211 shifts a phase of the IF base signal by 90 degrees. Further, the 90-degree phase shifter 211 may be an analog circuit and may not include any active elements. The mixer part 212 mixes the IF demodulation signal and the IF base signal and performs the demodulation so as to generate and output a demodulation signal having two frequency components, $(2f_{IF}-f_{NMR})$ and $f_{NMR}$. The low-pass filter 214 is a filter to attenuate a high frequency band component $(2f_{IF}-f_{NMR})$ among the two band components of $(2f_{IF}-f_{NMR})$ and $f_{NMR}$ that are obtained by the demodulation of the mixer part 212 of the above-mentioned demodulation signals and to pass a low frequency band component $(f_{NMR})$ among the two band components. The mixer part 213 mixes the IF demodulation signal and an IF base signal after a 90-degree phase shift and performs the demodulation so as to generate and output a demodulation signal having two frequency components $(2f_{IF}-f_{NMR})$ and $f_{NMR}$. The low-pass filter 215 is a filter to attenuate a high frequency band component $(2f_{IF}-f_{NMR})$ among the two band components of $(2f_{IF}-f_{NMR})$ and $f_{NMR}$ that are obtained by the demodulation of the mixer part 213 of the above-mentioned demodulation signal and to pass a low frequency band component $(f_{NMR})$ among the two band components. Note that the low-pass filters 214 and 215 are analog filters that are configured with only passive elements such as a capacitor, an inductor, or a resistor. For instance, the mixer parts 212 and 213 are DBMs that are configured with a diode and a phase distributor.

The digitizing device 202 respectively digitizes the above-mentioned demodulation signal I and demodulated signal Q (the frequency component $f_{NMR}$) and converts from an analog signal into a digital signal.

The control device 203 has a computer that operates according to a control program. The computer has such as a CPU, a ROM, a RAM, etc., and performs operations described below by loading the control program into the RAM and executing the control program on the CPU.

Specifically, in the same manner as the control device 22 does, the control device 203 controls the nuclear magnetic resonance sensing part 1 and the switching part 4 so that the nuclear magnetic resonance sensing part 1 applies the above-mentioned high frequency magnetic field and outputs the above-mentioned observation signal. Furthermore, the control device 203 receives a demodulation signal I and a demodulated signal Q (frequency component $f_{NMR}$) as digital signals from the digitizing device 202 and performs predetermined signal processing so as to extract the NMR signal (frequency component $f_{NMR}$). Further, in this predetermined signal processing, a Fourier transform such as a FFT (Fast Fourier Transform) is performed with respect to each of the demodulation signal I and the demodulated signal Q, and the frequency components of each of the demodulation signal I and the demodulated signal Q are identified. As a result, for instance, the NMR signal (frequency component $f_{NMR}$) is extracted and a chemical shift is detected.

Figure 7:
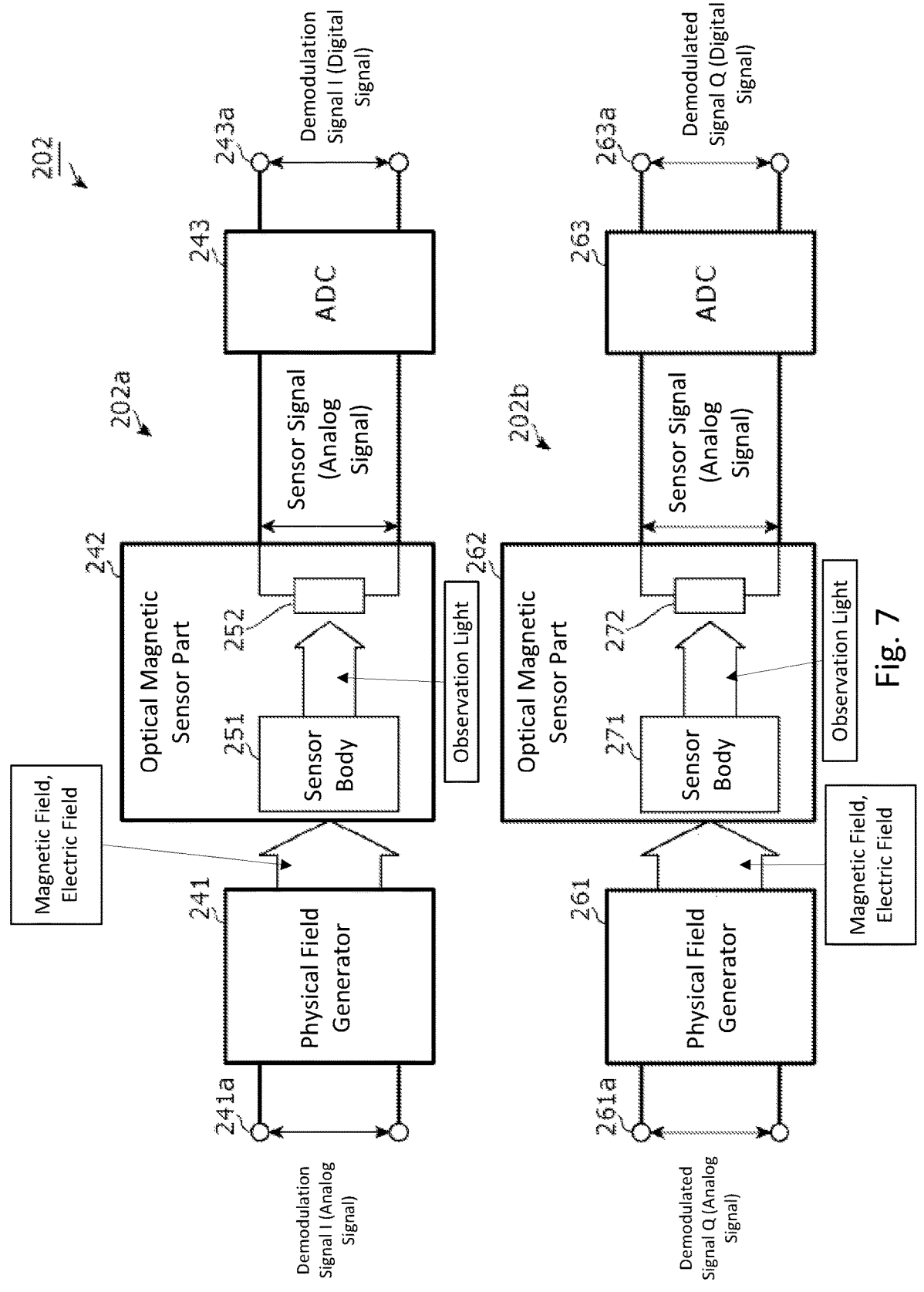
FIG. 7 is a block diagram that shows a configuration of a digitizing device 221 in the nuclear magnetic resonance sensing device according to the fourth embodiment.

FIG. 7 is a block diagram that shows a configuration of a digitizing device 221 in a nuclear magnetic resonance sensing device according to the fourth embodiment. The digitizing device 202 shown in FIG. 7 has a digitizing part 202a that digitizes a demodulation signal I and a digitizing part 202b that digitizes a demodulated signal Q.

The digitizing part 202a has a physical field generator 241 similar to the physical field generator 41, an optical quantum sensor part 242 similar to the optical quantum sensor part 42, and an A/D converter 243 similar to the A/D converter 43. Further, the digitizing part 202b has a physical field generator 261 similar to the physical field generator 41, an optical quantum sensor part 262 similar to the optical quantum sensor part 42, and an A/D converter 263 similar to the A/D converter 43.

The physical field generators 241 and 261 respectively generate magnetic fields corresponding to input signals (that is, analog IF demodulation signals) that are input via input terminals 241a and 261a of the physical field generators 241 and 261. For instance, the physical field generators 241 and 261 generate the magnetic fields using conductive coils or wirings.

The optical quantum sensor parts 242 and 262 respectively have sensor bodies 251 and 271 similar to the sensor body 51 and photoelectric elements 252 and 272 similar to the photoelectric elements 52. In the sensor bodies 251 and 271, the sensing members respectively generate lights (observation lights) corresponding to the magnetic fields that are generated by the physical field generators 241 and 261, and the photoelectric elements 252 and 272 respectively convert the lights into electrical signals as sensor signals. The photoelectric elements 252 and 272 are such as photodiodes or phototransistors and generate the sensor signals corresponding to the intensities of the entered observation lights.

In the fourth embodiment, the optical quantum sensor parts 242 and 262 (specifically, the sensor bodies 251 and 271) respectively perform quantum operations with respect to the sensing members so that the sensing members generate the above-mentioned observation lights according to the optically detected magnetic resonance measuring method (ODMR).

Further, in this embodiment, an optical system from the light emitting devices to the magnetic resonance members is also provided in the optical quantum sensor parts 242 and 262 in order to irradiate the magnetic resonance members with excitation lights in the same manner as the first embodiment. Further, in order to detect fluorescence (the observation light) from the magnetic resonance members, an optical system from the magnetic resonance members to the photoelectric elements is provided.

Further, in the same manner as the optical quantum sensor part 42, according to a predetermined measurement sequence, the optical quantum sensor parts 242 and 262 respectively (a) control the high frequency power sources and the light emitting devices, perform quantum operations using the microwaves and the laser lights, cause the sensor bodies 251 and 271 to generate the observation lights, and cause the photoelectric elements 252 and 272 to generate the sensor signals. This measurement sequence is set according to such as a frequency of the above-mentioned magnetic field in the same manner as the first embodiment.

The A/D converters 243 and 263 digitize the sensor signals that are output from the optical magnetic sensor part 242 (without directly digitizing the analog demodulation signal I and the demodulated signal Q). As a result, the A/D converters 243 and 263 generate digital signals as output signals corresponding to demodulation signal I and the demodulated signal Q and output the digital signals via the output terminals 243a and 263a of the A/D converters 243 and 263.

In this embodiment, in particular, the optical quantum sensor parts 242 and 262 (specifically, the sensor bodies 251 and 271) cause the sensing members to generate the above-mentioned observation lights as the levels of the sensor signals exceed the noise floors of the A/D converters 243 and 263.

Further, in the same manner as the first embodiment, factors, such as the efficiency of the sensing member, the light concentration efficiency of the observation light, and the conversion efficiency of the photoelectric elements 252 and 272, are determined under a condition in which a level of the sensor signal exceeds a noise floor of the A/D converter 43 depending on the noise floor (already known) of the A/D converter 43. As a result, for instance, the sensitivities of the optical quantum sensor parts 242 and 262 are set to 1.5 PT/Hz$^{1/2}$ or more. Further, the A/D converters 243 and 263 in this embodiment are high-resolution A/D converters and the values of the above-mentioned factors are determined as the level of the sensor signal exceeds a noise level of the thermal noise. Further, the reference voltages of the A/D converters 243 and 263 are set according to a range (a minimum level value and a maximum level value) of the sensor signal. Note that levels (or ranges) of the demodulation signal and the demodulated signal being input and the electromagnetic conversion efficiencies of the physical field generators 241 and 261 are already known.

Further, in this embodiment, in particular, the digitizing device 202 does not have an amplifier circuit, in which the sensor signal is electrically increased, between the photoelectric elements 252 and 272 and the A/D converters 243 and 263. Furthermore, in this embodiment, an amplifier circuit, in which the input signal is electrically increased, is not provided between the signal source of the input signal and the physical field generators 241 and 261. That is, in this embodiment, an electrical amplifier circuit that is a noise source is not provided at the upstream sides of the A/D converters 243 and 263.

Further, the optical quantum sensor parts 242 and 262 and the A/D converters 243 and 263 are electrically separated so as to prevent the electrical noise that is generated by optical quantum sensor parts 242 and 262 from invading (inputting) into the A/D converters 243 and 263.

Further, in the fourth embodiment, neither an amplifier circuit nor a buffer is provided between the nuclear magnetic resonance sensing part 1 and the digitizing device 202. That is, only passive elements are used in a circuit from the nuclear magnetic resonance sensing part 1 to the digitizing device 202 and the generation of the thermal noise is suppressed.

Next, operations of the nuclear magnetic resonance sensing device according to the fourth embodiment will be explained.

The control device 203 controls the nuclear magnetic resonance sensing part 1, and at the same time, controls the switching part 4 so as to apply the high frequency magnetic field based on the RF signal from a transmission system to the target object 101 in the nuclear magnetic resonance sensing part 1. Further, the control device 203 controls the switching part 4 so as to conduct the observation signal from the nuclear magnetic resonance sensing part 1 to a reception system. As shown in FIG. 6, the observation signal is converted into the IF demodulation signal by the mixer part 6. Further, the IF demodulation signal from which the component on the side of the high frequency band is removed by the low-pass filter 7 is input to the analog quadrature phase detection circuit 201.

The quadrature phase detection circuit 201 performs the quadrature phase detection with respect to the IF demodulation signal using the IF base signal, generates the demodulation signal I and the demodulated signal Q of the frequency component $f_{NMR}$, and inputs the demodulation signal I and the demodulated signal Q to the digitizing device 202.

In the digitizing device 202, when the demodulation signal I is applied to the physical field generator 241, the magnetic field with the intensity corresponding to the level of the input signal is generated in the physical field generator 241 and is applied to the sensor body 251 of the optical quantum sensor part 242. In the sensor body 251, the measurement sequence is executed as mentioned above and the light having a light quantity according to the strength of the magnetic field is generated. In the fourth embodiment, according to the ODMR, the magnetic resonance member generates the light having the light quantity according to the strength of the magnetic field. Thereafter, the photoelectric element 252 receives the light, generates the sensor signal having a level corresponding to the light quantity of the received light, and outputs the sensor signal to the A/D converter 243. The A/D converter 243 digitizes the sensor signal, generates the digital demodulation signal I corresponding to the analog demodulation signal I, and outputs the digital demodulation signal I to the control device 203.

Further, in parallel with the above description, in the digitizing device 202, when the demodulated signal Q is applied to the physical field generator 261, the magnetic field with the intensity corresponding to the level of the input signal is generated in the physical field generator 261 and is applied to the sensor body 271 of the optical quantum sensor part 262. In the sensor body 271, the measurement sequence is executed as mentioned above and the light having a light quantity according to the strength of the magnetic field is generated. In the fourth embodiment, according to the ODMR, the magnetic resonance member generates the light having the light quantity according to the strength of the magnetic field. Thereafter, the photoelectric element 272 receives the light, generates the sensor signal having a level corresponding to the light quantity of the received light, and outputs the sensor signal to the A/D converter 263. The A/D converter 263 digitizes the sensor signal, generates a digital demodulated signal Q corresponding to the analog demodulated signal Q, and outputs the digital demodulated signal Q to the control device 203.

The control device 203 continuously and repeatedly acquires the values of the digital demodulation signals I and the digital demodulated signals Q at each point in time, derives such as the NMR signals (specifically, for instance, $f_{NMR}$) and the chemical shift by the signal processing as mentioned above, and performs such as the molecular structure analysis and the imaging of the target object 101 based on such as the NMR signals and the chemical shift.

Note that the other configurations and operations of the nuclear magnetic resonance sensing device according to the fourth embodiment are the same as those explained in any of the first, second, and third embodiments. Therefore, the explanations of the other configurations and operations of the nuclear magnetic resonance sensing device will be omitted.

As mentioned above, according to the fourth embodiment, the analog quadrature phase detection circuit 201 performs the quadrature phase detection with respect to the intermediate frequency demodulation signal that has been passed through the low-pass filter 7 so as to generate the demodulation signal I and the demodulated Q of the nuclear magnetic resonance signal. The digitizing device 202 digitizes the demodulation signal I and demodulated signal Q. In the digitizing device 202, the physical field generators 241 and 261 respectively generate the magnetic fields or the electric fields corresponding to the above-mentioned demodulation signals and the above-mentioned demodulated signals. The sensing members in the optical quantum sensor parts 242 and 262 respectively generate the lights corresponding to the magnetic fields or the electric fields that are generated by the physical field generators 241 and 261. The photoelectric elements 252 and 272 in the optical quantum sensor parts 242 and 262 convert the lights that are generated by those sensing members into the electrical signals as the first and second sensor signals. The A/D converters 243 and 263 in the optical quantum sensor parts 242 and 262 respectively digitize the first and second sensor signals. Here, the optical quantum sensor parts 242 and 262 respectively perform the quantum operations with respect to the sensing members and cause the sensing members to generate the lights corresponding to the above-mentioned magnetic fields or electric fields.

As a result, the target: nuclear magnetic resonance signal and the chemical shift are detected while being distinguished from each other based on the demodulation signal I and the demodulated signal Q by the analysis in the control device 203. Therefore, it becomes possible to accurately detect the low-level nuclear magnetic resonance signal and perform the high-resolution nuclear magnetic resonance sensing.

Fifth Embodiment

Figure 8:
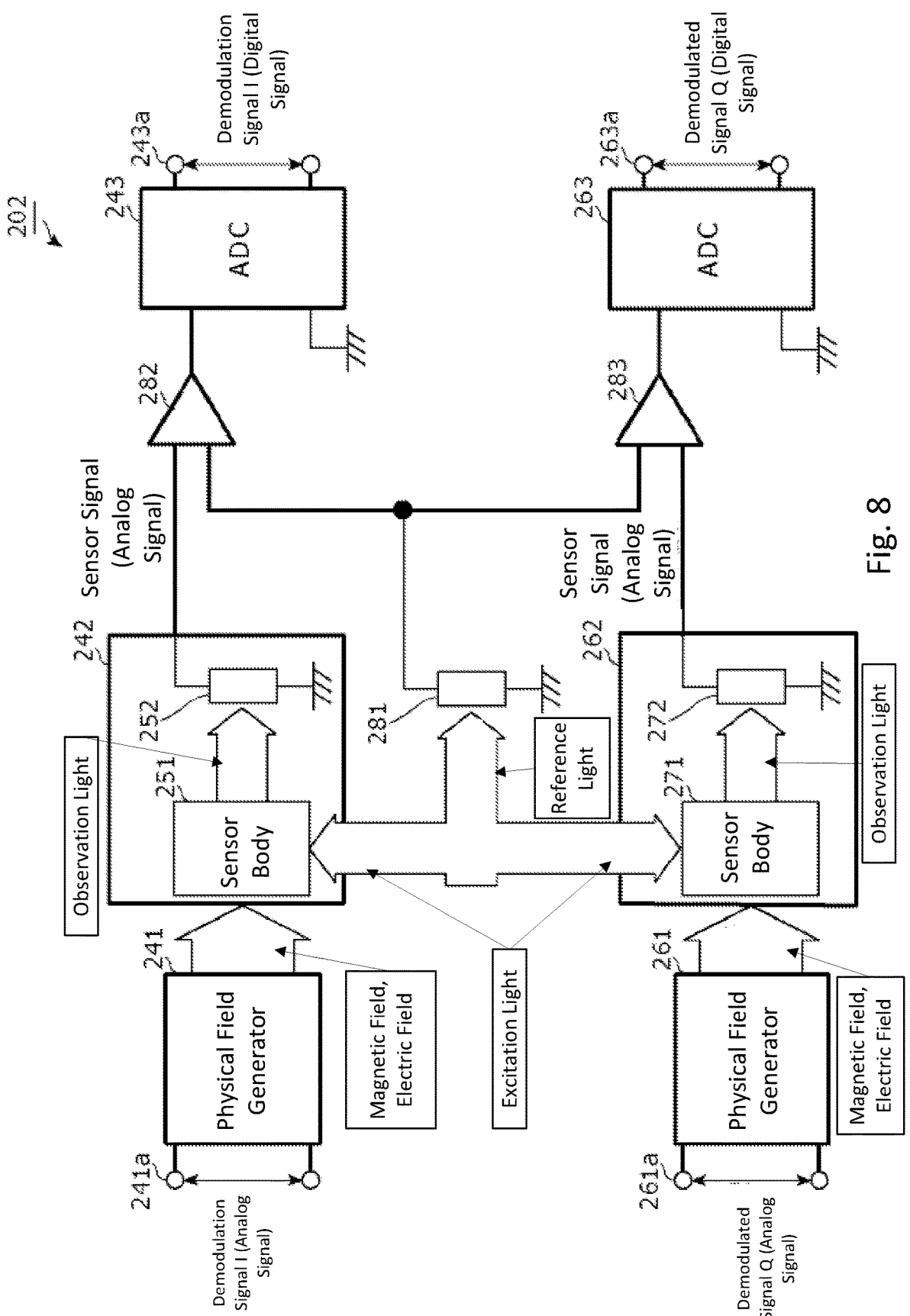
FIG. 8 is a block diagram that shows a configuration of a digitizing device 221 in a nuclear magnetic resonance sensing device according to a fifth embodiment.

FIG. 8 is a block diagram that shows a configuration of a digitizing device 221 in the nuclear magnetic resonance sensing device according to a fifth embodiment.

In the fifth embodiment, as shown in FIG. 8, the optical quantum sensor parts 242 and 262 perform the above-mentioned quantum operations by irradiating each of the sensing members with a common laser light (the above-mentioned excitation light) and cause the sensing members to respectively generate the lights corresponding to the magnetic fields or the electric fields that are generated by the physical field generators 241 and 261.

Figure 9:
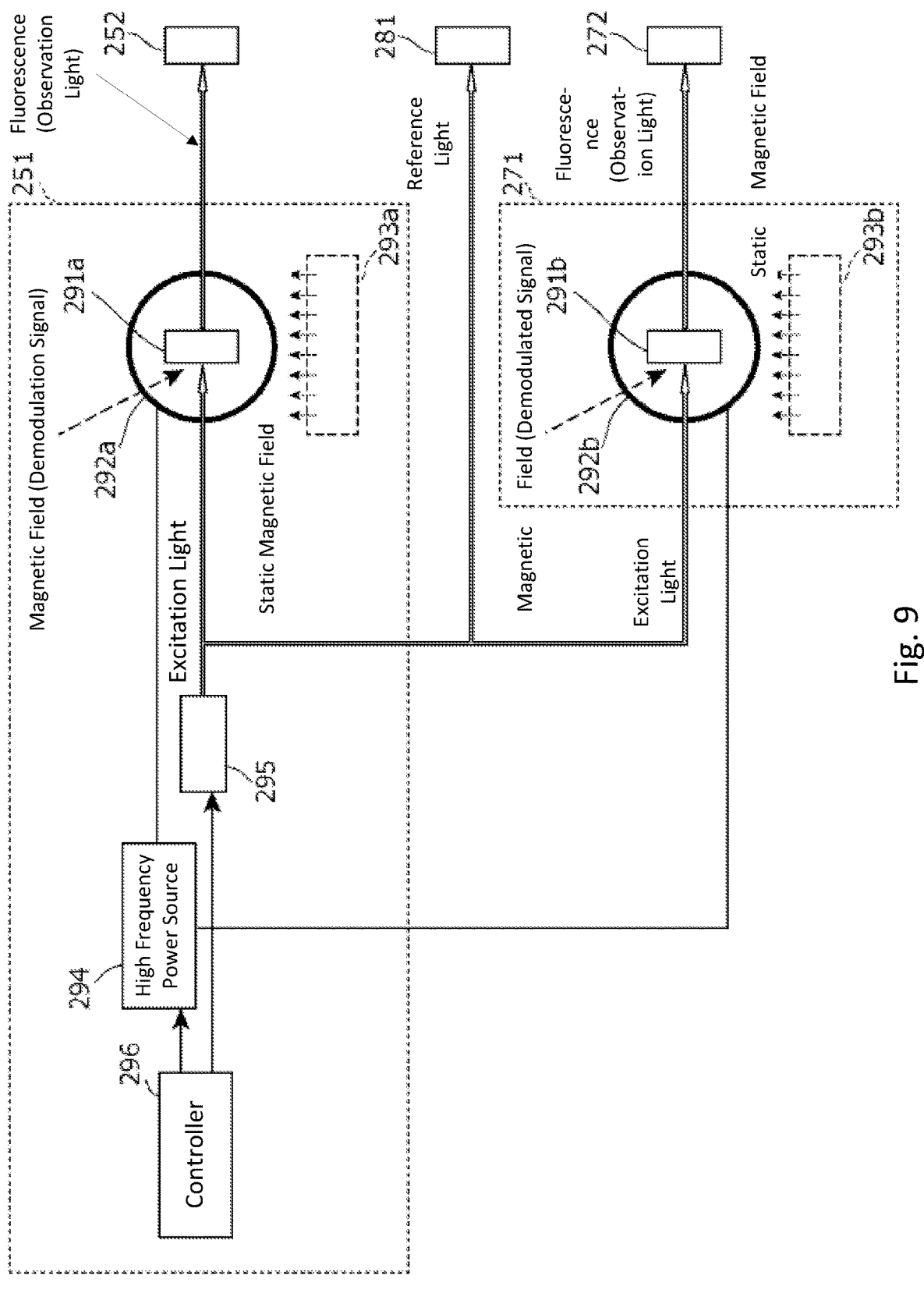
FIG. 9 is a diagram that shows a configuration of sensor bodies 251 and 271 of a digitizing device 202 according to the fifth embodiment.
Figure 10:
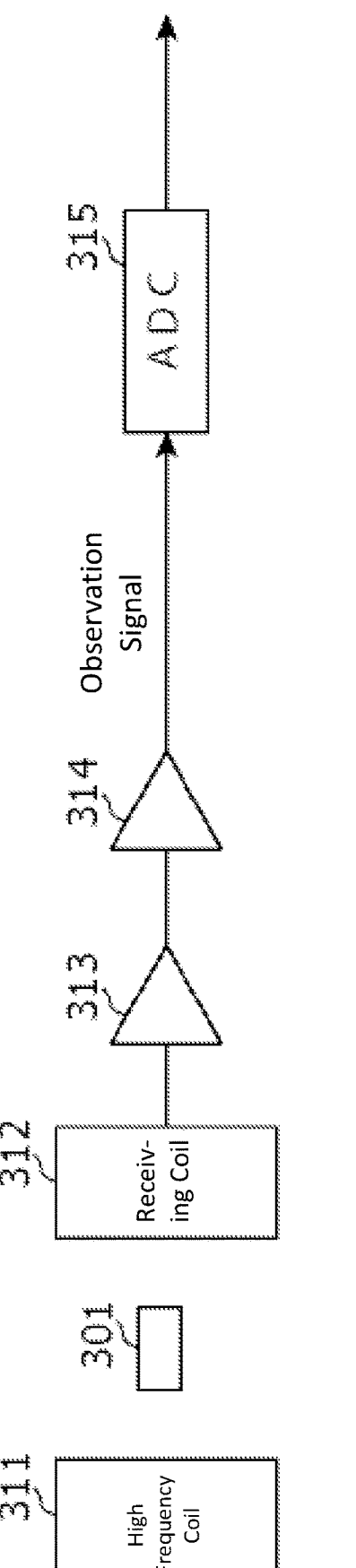
FIG. 10 is a block diagram that shows an example of a measurement device using the nuclear magnetic resonance.

FIG. 9 is a diagram that shows configurations of the sensor bodies 251 and 271 of the digitizing device 202 in the fifth embodiment.

Specifically, as shown in FIG. 9, in the fifth embodiment, for the ODMR, for instance, as shown in FIG. 9, the sensor bodies 251 and 271 respectively have magnetic resonance members 291a and 291b as the sensing members, high frequency magnetic field generators 292a and 292b, and magnets 293a and 293b. The sensor body 251 further has a high frequency power source 294, a light emitting device 295, and a controller 296. The high frequency power source 294, the light emitting device 295, and the controller 296 are a single high frequency power source, a light emitting device, and a controller that are common to two systems of the magnetic resonance members 291a and 291b and the high frequency magnetic field generators 292a and 292b. Further, the laser light emitted from the light emitting device 295 is branched by an optical system (not shown) into a laser light that enters into the magnetic resonance member 291a, a laser light that enters into the magnetic resonance member 291b, and a laser light that is used as a reference light that is mentioned below.

Note that the magnetic resonance members 291a and 291b, the high frequency magnetic field generators 292a and 292b, and the magnets 293a and 293b, the high frequency power source 294, the light emitting device 295, and the controller 296 are the same as the magnetic resonance member 61, the high frequency magnetic field generator 62, and the magnet 63, the high frequency power source 64, the light emitting device 65, and the controller 66.

Furthermore, here, the sensor body 251 has the high frequency power source 294, the light emitting device 295, and the controller 296. However, instead of the above configuration, the sensor body 271 may have the high frequency power source 294, the light emitting device 295, and the controller 296.

Further, in the fifth embodiment, as shown in FIGS. 8 and 9, the digitizing device 202 has a photoelectric element 281 and difference circuits 282 and 283 as analog circuits.

The photoelectric element 281 converts the reference light that is branched from the common laser light into an electrical signal as a third sensor signal. The photoelectric element 281 is, for instance, a photodiode or a phototransistor.

The difference circuit 282 respectively performs common mode rejection with respect to each sensor signal (first sensor signal) of the optical quantum sensor part 242 based on the third sensor signal. Specifically, the difference circuit 282 subtracts the third sensor signal from the first sensor signal and inputs the first sensor signal after the subtraction to the A/D converter 243. Further, the difference circuit 283 respectively performs the common mode rejection with respect to each sensor signal (second sensor signal) of the optical quantum sensor part 262 based on the third sensor signal. Specifically, the difference circuit 283 subtracts the third sensor signal from the second sensor signal and inputs the second sensor signal after the subtraction to the A/D converter 263.

Note that the photoelectric element 281 and the difference circuits 282 and 283 may be provided and may not be provided depending on necessity.

Next, operations of the nuclear magnetic resonance sensing device according to the fifth embodiment will be explained.

In the digitizing device 202 of the fifth embodiment, the optical quantum sensor parts 242 and 262 irradiate the magnetic resonance members 291a and 291b of the sensor bodies 251 and 271 with the common excitation light by using the single light emitting device 295. Thereafter, the optical quantum sensor parts 242 and 262 generate and output the first sensor signal corresponding to the demodulation signal I and the second sensor signal corresponding to the demodulated signal Q and, at the same time, generate and output the third sensor signal corresponding to the reference light.

The difference circuits 282 and 283 respectively subtract the third sensor signal from the first and second sensor signals and respectively input the first and second sensor signals after the subtractions to the A/D converters 243 and 263.

Note that the other configurations and operations of the nuclear magnetic resonance sensing device according to the fifth embodiment are the same as those explained in the fourth embodiment. Therefore, the explanations of the other configurations and operations of the nuclear magnetic resonance sensing device will be omitted.

As mentioned above, according to the fifth embodiment, because the single laser light is used as the excitation light that is common to the magnetic resonance members 291*a* and 291*b*, a deviation of output characteristics between the optical quantum sensor parts 242 and 262 is suppressed. Further, noise components included in the first and second sensor signals due to a noise component included in the laser light that is generated by the light emitting device 295 are suppressed.

Note that various changes and modifications to the embodiments described above will be apparent to one having ordinally skill in the art. Such the changes and modifications may be made without departing from the spirit and scope of the subject matter and without diminishing the intended advantages. That is, it is intended that such changes and modifications are included within the scope of the claims.

For instance, in the first to fifth embodiments, the measurement methods in the sensor bodies 51, 251, and 271 are not limited to the above-mentioned ODMR and OPAM. As long as being a measurement method in which a quantum operation with respect a sensing member is performed by using the sensing member according to a physical field and it is capable of detecting observation light according to the physical field strength, any other measurement methods may be used.

Further, in the first to fifth embodiments, a predetermined arithmetic processing with respect to the output signals in the control device 22 may be performed so that the values (digital values) of the output signals of the digitizing devices 21 and 202 coincident with the levels of the analog IF demodulation signals.

Furthermore, in the first to fifth embodiments, as necessary, a low noise buffer (voltage amplification degree=1) that satisfies a noise level requirement may be provided between the low-pass filter 7 and the digitizing devices 21 and 202.

INDUSTRIAL APPLICABILITY

The present invention can be applicable to, for instance, various measurements and imaging using nuclear magnetic resonance.

The invention claimed is:

1. A nuclear magnetic resonance sensing device comprising:
   a nuclear magnetic resonance sensing part that applies a high frequency magnetic field based on an RF signal to a target object and generates an observation signal with a frequency that is shifted from a frequency of the RF signal by a frequency of a nuclear magnetic resonance signal;

a mixer part that performs intermediate frequency demodulation of the observation signal and generates an intermediate frequency demodulation signal including the nuclear magnetic resonance signal;
   a low-pass filter that attenuates a high frequency component higher than an intermediate frequency of the intermediate frequency demodulation of the intermediate frequency demodulation signal and passes a frequency component of the nuclear magnetic resonance signal; and
   a digitizing device that digitizes the intermediate frequency demodulation signal that has passed through the low-pass filter,
   wherein the digitizing device includes:
      a physical field generator that generates a magnetic field or an electric field corresponding to the intermediate frequency demodulation signal that has passed through the low-pass filter;
      an optical quantum sensor part that generates light corresponding to the magnetic field or the electric field by a sensing member and converts the light into an electrical signal as a sensor signal by a photoelectric element; and
      an analog/digital converter that digitizes the sensor signal, and
   the optical quantum sensor part performs a quantum operation with respect to the sensing member and causes the sensing member to generate the light corresponding to the magnetic field or the electric field.

2. The nuclear magnetic resonance sensing device according to claim 1, further comprising:
   a base signal generation device that generates a RF base signal and an intermediate frequency base signal; and
   a transmission system mixer part that mixes the RF base signal and the intermediate frequency base signal to generate the RF signal,
   wherein the mixer part performs the intermediate frequency demodulation of the observation signal by the RF base signal to generate the intermediate frequency demodulation signal including the nuclear magnetic resonance signal, and
   the optical quantum sensor part uses the intermediate frequency base signal as a synchronizing signal, performs the quantum operation with respect to the sensing member according to the synchronizing signal periodically and repeatedly, and causes the sensing member to generate the light corresponding to the magnetic field or the electric field.

3. The nuclear magnetic resonance sensing device according to claim 1,
   wherein neither an amplifier circuit nor a buffer is provided between the nuclear magnetic resonance sensing part and the digitizing device.

4. The nuclear magnetic resonance sensing device according to claim 1,
   wherein the optical quantum sensor part causes the sensing member to generate the light so that a level of the sensor signal exceeds a noise floor of the analog/digital converter.

5. The nuclear magnetic resonance sensing device according to claim 1,
   Wherein an amplifier circuit in which the sensor signal is increased is not provided between the photoelectric element and the analog/digital converter.

6. The nuclear magnetic resonance sensing device according to claim 1, wherein the optical quantum sensor part performs the quantum operation with respect to the sensing member according to an optically detected magnetic resonance measuring method or an optically pumped atomic magnetic force measurement method, and causes the sensing member to generate the light corresponding to the magnetic field or the electric field.

7. A nuclear magnetic resonance sensing device comprising:

a nuclear magnetic resonance sensing part that applies a high frequency magnetic field based on an RF signal to a target object and generates an observation signal with a frequency that is shifted from a frequency of the RF signal by a frequency of a nuclear magnetic resonance signal;

a mixer part that performs intermediate frequency demodulation of the observation signal and generates an intermediate frequency demodulation signal including the nuclear magnetic resonance signal;

a low-pass filter that attenuates a high frequency component higher than an intermediate frequency of the intermediate frequency demodulation of the intermediate frequency demodulation signal and passes a frequency component of the nuclear magnetic resonance signal;

an analog quadrature phase detection circuit that performs quadrature phase detection with respect to the intermediate frequency demodulation signal that has passed through the low-pass filter and generates a demodulation signal and a demodulated signal of the nuclear magnetic resonance signal; and a digitizing device that digitizes the demodulation signal and the demodulated signal, wherein the digitizing device includes:

a first physical field generator that generates a magnetic field or an electric field corresponding to the demodulation signal;

a second physical field generator that generates a magnetic field or an electric field corresponding to the demodulated signal;

a first optical quantum sensor part that generates light, by a first sensing member, corresponding to the magnetic field or the electric field generated by the first physical field generator and converts, by a first photoelectric element, the light generated by the first sensing member into an electrical signal as a first sensor signal;

a second optical quantum sensor part that generates light, by a second sensing member, corresponding to the magnetic field or the electric field generated by the second physical field generator and converts, by a second photoelectric element, the light generated by the second sensing member into an electrical signal as a second sensor signal;

a first analog/digital converter that digitizes the first sensor signal; and a second analog/digital converter that digitizes the second sensor signal, and the first and second optical quantum sensor parts respectively perform quantum operations with respect to the first and second sensing members and respectively cause the first and second sensing members to generate the lights corresponding to the magnetic fields or the electric fields.

8. The nuclear magnetic resonance sensing device according to claim 7, wherein the first and second optical quantum sensor parts respectively perform the quantum operations with respect to the first and second sensing members by irradiating common laser light thereto and respectively cause the first and second sensing members to generate the lights corresponding to the magnetic fields or the electric fields.

9. The nuclear magnetic resonance sensing device according to claim 8, further comprising:

a third photoelectric element that converts reference light that is branched from the common laser light into an electrical signal as a third sensor signal;

a first difference circuit that respectively performs common mode rejection on the first sensor signal based on the third sensor signal; and a second difference circuit that respectively performs common mode rejection on the second sensor signal based on the third sensor signal.

10. A nuclear magnetic resonance sensing method comprising:

a step of applying a high frequency magnetic field based on an RF signal to a target object and generating an observation signal with a frequency that is shifted from a frequency of the RF signal by a frequency of a nuclear magnetic resonance signal;

a step of performing intermediate frequency demodulation of the observation signal and generating an intermediate frequency demodulation signal including the nuclear magnetic resonance signal;

a step of attenuating, by a low-pass filter, a high frequency component higher than an intermediate frequency of the intermediate frequency demodulation of the intermediate frequency demodulation signal and passing a frequency component of the nuclear magnetic resonance signal; and a digitizing step of digitizing, by a digitizing device, the intermediate frequency demodulation signal that has passed through the low-pass filter, wherein the digitizing step includes:

(a) generating a magnetic field or an electric field corresponding to the intermediate frequency demodulation signal that has passed through the low-pass filter;

(b) generating light corresponding to the magnetic field or the electric field by a sensing member;

(c) converting the light into an electrical signal as a sensor signal by a photoelectric element; and (d) digitizing the sensor signal by an analog/digital converter, and in the digitizing step, a quantum operation with respect to the sensing member is performed, and the sensing member is caused to generate the light corresponding to the magnetic field or the electric field.

11. A nuclear magnetic resonance sensing method comprising:

a step of applying a high frequency magnetic field based on an RF signal to a target object and generating an observation signal with a frequency that is shifted from a frequency of the RF signal by a frequency of a nuclear magnetic resonance signal;

a step of performing intermediate frequency demodulation of the observation signal and generating an intermediate frequency demodulation signal including the nuclear magnetic resonance signal;

a step of attenuating, by a low-pass filter, a high frequency component higher than an intermediate frequency of the intermediate frequency demodulation of the intermediate frequency demodulation signal and passing a frequency component of the nuclear magnetic resonance signal;

a step of performing, by an analog circuit, quadrature phase detection with respect to the intermediate frequency demodulation signal that has passed through the low-pass filter and generating a demodulation signal and a demodulated signal of the nuclear magnetic resonance signal; and a digitizing step of digitizing the demodulation signal and the demodulated signal, wherein the digitizing step includes:

(a1) generating a magnetic field or an electric field corresponding to the demodulation signal;

(a2) generating a magnetic field or an electric field corresponding to the demodulated signal;

(b1) generating light, by a first sensing member, corresponding to the magnetic field or the electric field corresponding to the demodulation signal and converting, by a photoelectric element, the light generated by the first sensing member into an electrical signal as a first sensor signal;

(b2) generating light, by a second sensing member, corresponding to the magnetic field or the electric field corresponding to the demodulated signal and converting, by a photoelectric element, the light generated by the second sensing member into an electrical signal as a second sensor signal;

(c1) digitizing the first sensor signal; and (c2) digitizing the second sensor signal, in the digitizing step, quantum operations with respect to the first and second sensing members are respectively performed, and the first and second sensing members are respectively caused to generate the lights corresponding to the magnetic fields or the electric fields corresponding to the demodulation signal and the demodulated signal.

* * * * *